(12) United States Patent
Le Tual et al.

(10) Patent No.: US 10,917,106 B2
(45) Date of Patent: Feb. 9, 2021

(54) ELECTRONIC DEVICE FORMING A DIGITAL-TO-ANALOG CONVERTER AND A MIXER

(71) Applicants: STMicroelectronics SA, Montrouge (FR); STMicroelectronics (Alps) SAS, Grenoble (FR)

(72) Inventors: Stephane Le Tual, St. Egreve (FR); Jean-Pierre Blanc, Theys (FR); David Duperray, Saint Ismier (FR)

(73) Assignees: STMicroelectronics SA, Montrouge (FR); STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 16/709,391

(22) Filed: Dec. 10, 2019

(65) Prior Publication Data

US 2020/0212927 A1      Jul. 2, 2020

(30) Foreign Application Priority Data

Dec. 28, 2018   (FR) ...................................... 18 74286

(51) Int. Cl.
   *H03M 1/66*   (2006.01)
   *H03M 1/68*   (2006.01)
   *H03M 1/06*   (2006.01)

(52) U.S. Cl.
   CPC ......... *H03M 1/685* (2013.01); *H03M 1/0624* (2013.01)

(58) Field of Classification Search
   CPC ............................ H03M 1/685; H03M 1/0624
   USPC ...................................................... 341/144
   See application file for complete search history.

(56) References Cited

U.S. PATENT DOCUMENTS

| 5,148,163 A | * | 9/1992 | Frindle | ............... H03M 1/0641 |
| | | | | 341/131 |
| 6,150,970 A | * | 11/2000 | Anagnos | ............. H03M 1/0682 |
| | | | | 341/110 |
| 6,873,275 B2 | * | 3/2005 | Komamura | ............. H03M 5/08 |
| | | | | 341/143 |

(Continued)

FOREIGN PATENT DOCUMENTS

EP         2383894 A1      11/2011

OTHER PUBLICATIONS

INPI Search Report and Written Opinion for FR 1874286 dated Nov. 13, 2019 (7 pages).

(Continued)

*Primary Examiner* — Peguy Jean Pierre
(74) *Attorney, Agent, or Firm* — Crowe & Dunlevy (57) ABSTRACT

An acquisition stage receives a digital input signal and generates therefrom a first digital signal and a second digital signal complementary thereto. First and second processing stages receive the first and second digital signals and generate therefrom first and second analog signals in time with first and second complementary clock signals. An output stage generates an internal clock signal equivalent to one of: the first clock signal phase shifted by a duration of a transient occurring during a period of the first clock signal, or the second clock signal phase shifted by a duration of a transient occurring during a period of the second clock signal. The output stage produces an analog output signal equal to the first analog signal when the internal clock signal is at a first logic level, and equal to the second analog signal when the internal clock signal is at a second logic level.

16 Claims, 4 Drawing Sheets

(56) References Cited

U.S. PATENT DOCUMENTS 8,717,213 B1 *   5/2014  Wong .................. H04B 1/40
                                                341/144

OTHER PUBLICATIONS

Munehiko Nagatani et al: "A 32-GS/s 6-BIT Double Sampling DAC in INP HBT Technology", Compound Semiconductor Integrated Circuit Symposium 2009, Oct. 11, 2009 pp. 1-4.
Tannert Tobias et al: "A SIGE-HBT 2:1 Analog Multiplexer With More Than 67 GHZ Bandwidth", 2017 IEEE Bipolar/BICMOS Circuits and Technology Meeting (BCTM), Oct. 19, 2017 p. 146-149.

* cited by examiner

ELECTRONIC DEVICE FORMING A DIGITAL-TO-ANALOG CONVERTER AND A MIXER

PRIORITY CLAIM

This application claims the priority benefit of French Application for Patent No. 1874286, filed on Dec. 28, 2018, the content of which is hereby incorporated by reference in its entirety to the maximum extent allowable by law.

TECHNICAL FIELD

Embodiments relate to electronic devices, and more particularly to those electronic devices referred to as mixing digital-to-analog converters (also known as mixing DACs), that are capable of operating both as a digital-to-analog converter and as a mixer.

BACKGROUND

A conventional digital-to-analog converter clocked at a sampling frequency fs is generally configured to convert a digital signal, the value of which is coded on a plurality of bits, into an analog signal, the analog value of which is proportional to the coded digital value.

A mixing digital-to-analog converter is known to those skilled in the art and generally integrated as a digital-to-analog converter, such as described above, with a mixer that is configured to combine the analog signal delivered by the converter and a mixing signal (which is more commonly known as a transposition signal) received by the digital-to-analog converter, so as to frequency-transpose the input signal in order to deliver a frequency-transposed output signal.

The transposition signal may, for example, have a frequency that is equal to the sampling frequency fs. In this case, it is possible to obtain, at the output of such a mixing DAC electronic device, a signal that is transposed around the sampling frequency.

Furthermore, the response in terms of frequency f of such a mixing DAC electronic device is a function of the type:

$$\frac{\sin^2\left(\frac{\pi f}{2fs}\right)}{\left(\frac{\pi f}{2fs}\right)},$$

whereas that of the digital-to-analog converter is a function of the type:

$$\frac{\sin\left(\frac{\pi f}{fs}\right)}{\left(\frac{\pi f}{fs}\right)}.$$

Consequently, for a frequency transposition around the sampling frequency fs, such a mixing DAC electronic device delivers an output power that is greater with respect to the case of a conventional digital-to-analog converter.

Furthermore, with respect to the conventional combination of a digital-to-analog converter and a mixer, the structure of such a mixing DAC electronic device is generally more compact in terms of silicon area and consumes less power.

More specifically, the conventional structure of such a mixing DAC device includes processing circuitry that is configured to receive a digital input signal including N bits.

The processing circuitry includes N processing cells, each of which is configured to receive a corresponding bit of the digital input signal and a transposition signal, and each of which is configured to generate a corresponding mixed analog signal.

The processing circuitry also includes output circuitry that is configured to combine all of the mixed analog signals so as to generate a mixed analog output signal.

The transposition signal is generally generated by at least one local oscillator of the mixing DAC electronic device.

However, the placement of the local oscillator and the distribution of the transposition signal within the mixing DAC electronic device increase not only the complexity of the design of the electronic device but also the silicon area and the consumption of the electronic device.

What is more, there are also timing mismatches between the mixed analog signals generated by the N processing cells. It should be noted that a timing mismatch of the order of picoseconds between mixed analog signals having a frequency of the order of gigahertz may already be of concern for the performance of the mixing DAC electronic device and result in errors in the mixed analog output signal.

To address these timing mismatch problems, an additional processing circuit is generally used in the mixing DAC electronic device to calibrate these timing mismatches, further increasing the complexity, the silicon area and the consumption of the mixing DAC electronic device.

Thus, there is a need to provide a technical approach of low complexity and having a smaller footprint in terms of silicon area to make it possible to carry out, in the same structure, digital-to-analog conversion and frequency transposition of a digital input signal without compromising performance.

SUMMARY

According to one aspect, what is proposed is an electronic device.

This electronic device includes: an acquisition stage configured to receive a digital input signal and configured to generate, respectively, a first digital signal and a second digital signal which is the opposite of the first digital signal; a first processing stage and a second processing stage that are configured to receive, respectively, the first digital signal and the second digital signal and are configured to generate, respectively, a first analog signal in time with a first clock signal and a second analog signal in time with a second clock signal which is the opposite of the first clock signal, to within a tolerance; and an output stage configured to generate an analog output signal equal to the first analog signal or to the second analog signal depending on the value of the first or second clock signal.

Using such an acquisition stage making it possible to generate, from a single digital input signal, the first and second digital signals may advantageously decrease the input data rate of the digital input signal, for example by a factor of two.

Furthermore, the use of such first and second processing stages receiving as input, respectively, the first and second digital signals and clocked, respectively, by the first clock signal and the second clock signal having a phase offset equal to 180° to within a tolerance with respect to the first clock signal advantageously allows frequency transpositions to be carried out in the digital domain instead of in the analog domain as proposed in conventional approaches.

Here again, the first and second clock signals are used here as transposition signals. With the output stage controlled according to the first or second clock signal, the electronic device is capable of generating, from the first and second digital input signals, the analog output signal while using the first clock signal and the opposite of the first clock signal.

In other words, the device does not use a local oscillator to provide a transposition signal, nor does it use an additional processing circuit in each of the first and second processing stages to calibrate potential timing mismatches between the first and second analog signals.

Regarding the phase offset between the first clock signal and the second clock signal, it should be noted that a person skilled in the art will know how to choose a suitable tolerance according to the envisaged application, for example. By way of non-limiting indication, the tolerance may, for example, be of the order of 5%.

According to one embodiment, the digital input signal and the first and second digital signals each include N bits, and the acquisition stage has N inverters that are configured to generate, respectively, N bits of the second digital signal from N bits of the digital input signal.

Decreasing the input data rate of the digital input signal advantageously results in a decrease in the number of bits, in the silicon area occupied by the stage, and in the consumption of the acquisition stage configured to receive the digital input signal.

By way of non-limiting example, the first and second processing stages may each include a digital-to-analog converter.

According to another embodiment, the digital-to-analog converters of the first and second processing stages are current-steering digital-to-analog converters.

According to yet another embodiment, the output stage includes an analog multiplexer configured to generate the analog output signal equal to the first analog signal or to the second analog signal depending on the value of the first or second phase-shifted clock signal.

By way of non-limiting indication, the phase shift of the first phase-shifted clock signal may for example correspond at least to the duration of a transient state of the first or second analog signal in a period of the first or of the second clock signal.

The electronic device may for example be formed in an integrated manner.

According to another aspect, what is proposed is a communication system including an electronic device such as defined above.

According to yet another aspect, what is proposed is an electronic apparatus such as a mobile telephone, incorporating at least one communication system such as defined above.

BRIEF DESCRIPTION OF THE DRAWINGS

Other advantages and features will become apparent upon examining the detailed description of completely non-limiting embodiments and the appended drawings, in which.

DETAILED DESCRIPTION

Figure 1:
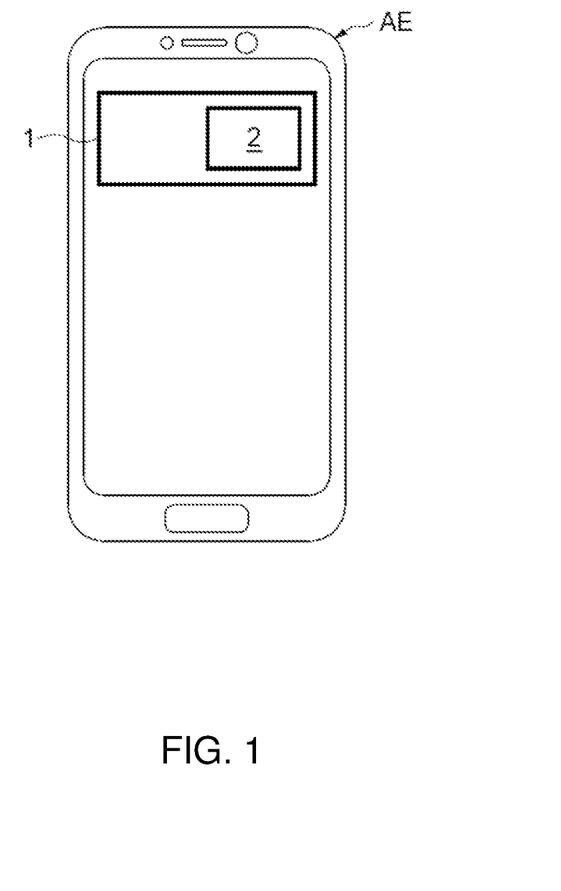
FIG. 1 schematically illustrates an electronic apparatus in the form of a "smartphone" type of mobile telephone.

FIG. 1 illustrates an electronic apparatus AE, here for example a "smartphone" type of mobile telephone.

This mobile telephone AE includes a communication system 1, for example in accordance with a mobile telephony network standard based on Long-Term Evolution (LTE) technology.

This communication system 1 comprises an electronic device 2 formed in an integrated manner with nondiscrete components and configured to operate both as a digital-to-analog converter and as a frequency mixer.

Figure 2:
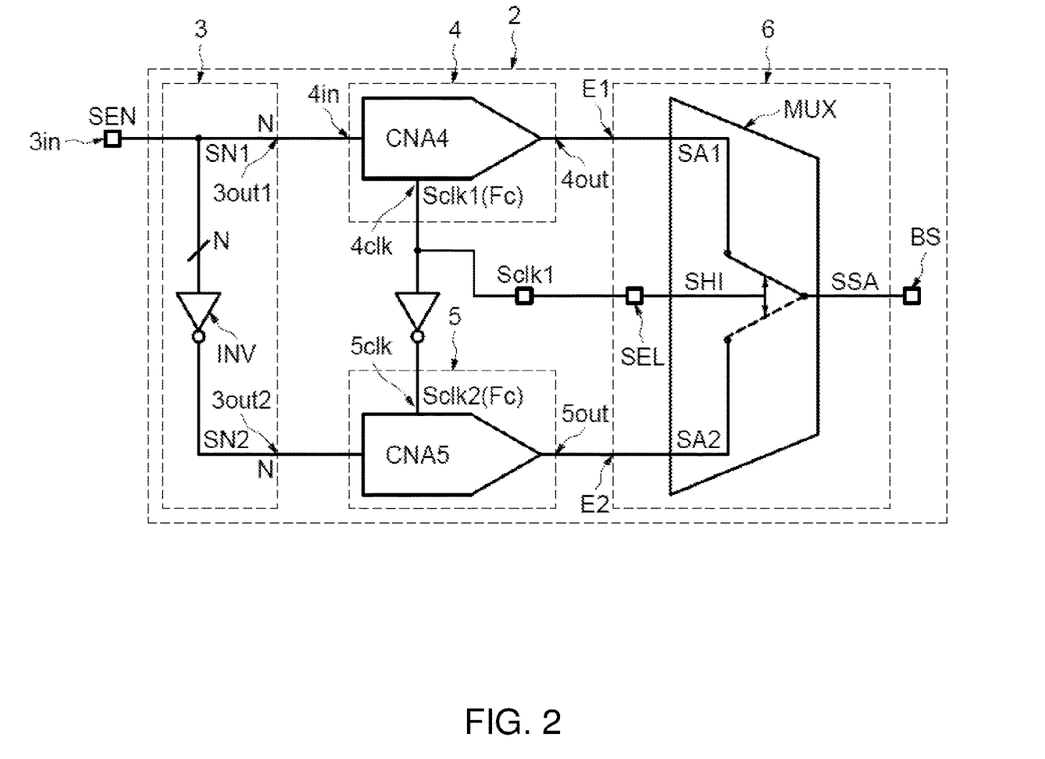
FIG. 2 schematically illustrates electronic device including an acquisition stage, a first processing stage, a second processing stage and an output stage.

Reference is now made to FIG. 2 in order to illustrate, in greater detail, one exemplary embodiment of the electronic device 2 including an acquisition stage 3, a first processing stage 4, a second processing stage 5 and an output stage 6.

The acquisition stage 3 is configured to receive, at its input 3in, a digital input signal SEN including N bits and including a first output 3out1 that is coupled directly to the input 3in, and N inverters INV that are coupled between the input 3in and a second output 3out2.

The output stage 6 will then deliver, over an output terminal BS, an analog output signal SSA that is frequency-transposed as will be seen in greater detail below.

The acquisition stage 3 is configured to deliver: to the first output 3out1, a first digital signal SN1 that is equal to the digital input signal SEN; and to the second output 3out2, a second digital signal SN2, which is the opposite (i.e., logical inverse) of the first digital signal SN1 or of the digital input signal SEN.

Advantageously, the acquisition stage 3 generates two digital signals SN1, SN2 of N bits from the digital input signal SEN of N bits.

Consequently, with respect to directly using an input signal having 2*N bits, the data rate of the digital input signal is decreased.

What is more, the use of the first and second digital signals SN1, SN2 having logically inverted values in conjunction with the first and second processing stages and the output stage advantageously allows frequency transposition in digital mode.

The first processing stage 4 includes a first digital-to-analog converter CNA4 including: an input terminal 4in configured to receive the first digital signal SN1; a clock terminal 4clk configured to receive a first clock signal Sclk1 having a conversion (transposition) frequency Fc; and an output terminal 4out coupled to the output stage 6.

The second processing stage 5 includes a second digital-to-analog converter CNA5 including: an input terminal 5in configured to receive the second digital signal SN2; an clock terminal 5clk configured to receive a second clock signal Sclk2; and an output terminal 5out coupled to the output stage 6.

The converters CNA4, CNA5 of the first and second processing stages 4, 5 may, for example, be identical.

It should be noted that the first and second clock signals Sclk1, Sclk2 may, for example, here be squarewave signals and that the second clock signal Sclk2 is phase-shifted by 180° (i.e., logically inverted) to within a tolerance with respect to the first clock signal Sclk1. The first and second clock signals Sclk1, Sclk2 are also used here as a transposition signals having the transposition frequency Fc.

Consequently, the first digital-to-analog converter CNA4 is configured to convert the first digital signal SN1 into a first analog signal SA1 in time with the first clock signal Sclk1.

In the same way, the second digital-to-analog converter CNA5 is configured to convert the second digital signal SN2, i.e., the opposite of the first digital signal SN1, into a second analog signal SA2 in time with the second clock signal Sclk2, i.e., in time with the first clock signal Sclk1 phase-shifted by 180° to within a tolerance.

Consequently, the second analog signal SA2 generated at the output terminal 5out of the second digital-to-analog converter CNA5 is inverted and phase-shifted by 180° to within a tolerance with respect to the first analog signal SA1 generated at the output terminal 4out of the first digital-to-analog converter CNA4.

The output stage 6 includes an analog multiplexer MUX including a first input E1 and a second input E2.

The first input E1 is configured to receive the first analog signal SA1 and the second input E2 is configured to receive the second analog signal SA2.

The multiplexer MUX further includes an output terminal BS and a selection terminal SEL that is configured to receive the first or the second clock signal Sclk1 or Sclk2 as a selection signal.

For the sake of simplicity, FIG. 2 illustrates a case in which the selection terminal SEL receives the first clock signal Sclk1.

The multiplexer MUX is therefore configured to deliver, to the output terminal BS, the analog output signal SSA equal to the first analog signal SA1 or to the second analog signal SA2 depending on the value of the first or of the second clock signal Sclk1 or Sclk2.

It should be noted that, each time the values of the first and second analog signals SA1, SA2 are changed, there is generally a transient state before the values of the first and second analog signals SA1, SA2 become stable.

To avoid potential errors caused during these transient states when changing the values of the first and second analog signals SA1, SA2, the multiplexer MUX is preferably configured to generate an internal clock signal SHI from the received first or the second clock signal Sclk1 or Sclk2.

This internal clock signal SHI is equal to the first clock signal Sclk1 phase-shifted by a phase shift corresponding at least to the duration of the transient state of, i.e., the duration of the establishment time TS for the first or second analog signal SA1, SA2 in one period of the first clock signal Sclk1.

Figure 3:
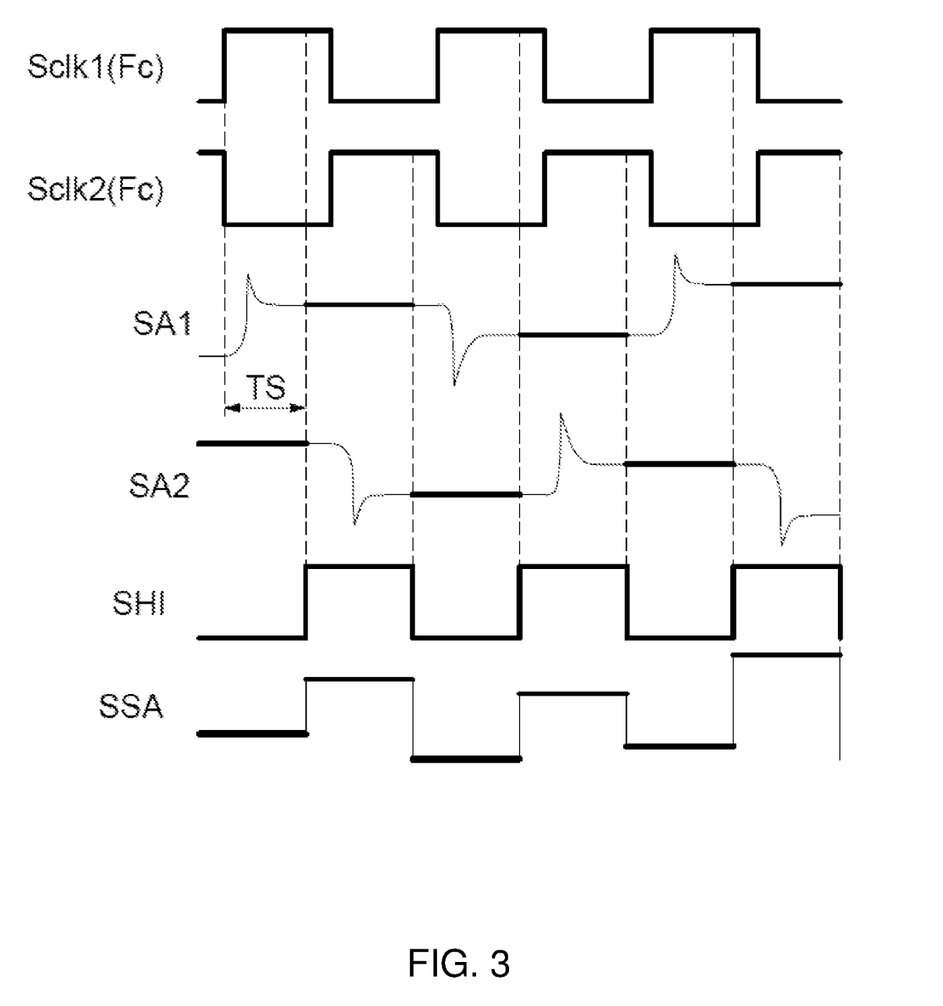
FIG. 3 schematically illustrates a timing diagram for an exemplary implementation of the generation of an analog output signal.

Reference will now be made to FIG. 3 to illustrate the timing diagram for an exemplary implementation of the generation of the analog output signal SSA.

The upper portion of FIG. 3 illustrates: the first clock signal Sclk1 having the conversion (transposition) frequency Fc; the first analog signal SA1 synchronized with each rising edge of the first clock signal Sclk1; and the second analog signal SA2 synchronized with each rising edge of the second clock signal Sclk2.

It may also be seen that the internal clock signal SHI is the first clock signal Sclk1 having undergone a time shift, this shift being here greater than the establishment time TS for the first or second analog signal SA1, SA2 in one period of the first clock signal Sclk1.

As indicated above, the second analog signal SA2, exhibiting a phase shift by 180° to within a tolerance, is equal to the phase opposite of the first analog signal SA1.

The multiplexer MUX is configured to generate the analog output signal SSA, which is equal: when the internal clock signal SHI is in the high state, to the first analog signal SA1; and when the internal clock signal SHI is in the low state, to the second analog signal SA2.

Consequently, it may be seen in FIG. 3 that the analog output signal SSA generated by the output stage 6 is not affected by the establishment time TS for the first and second analog signals SA1, SA2.

Thus, a mixing DAC electronic device of low complexity, having a smaller footprint and low consumption, capable of carrying out digital-to-analog conversion of a digital input signal and frequency transposition of this digital input signal without using one or more local oscillators or an additional circuit to calibrate potential timing mismatches is obtained.

It should be noted that the converters CNA4, CNA5 used in the first and second processing stages 4, 5 may be conventional digital-to-analog converters of any type.

Figure 4:
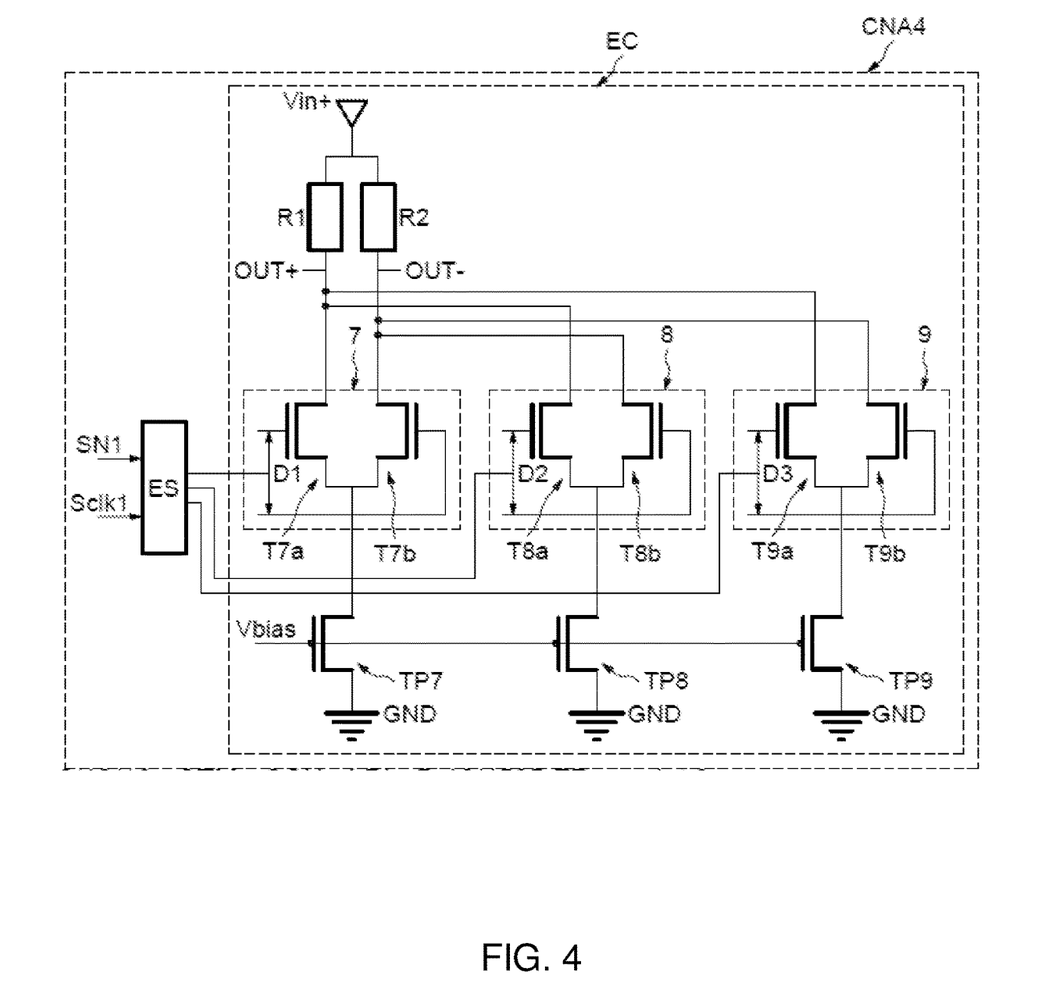
FIG. 4 schematically illustrates an embodiment of a converter.

With this in mind, reference is now made to FIG. 4 to illustrate an exemplary embodiment of the converter CNA4 or CNA5, here for example the converter CNA4.

This converter CNA4 is, for example, a current-steering digital-to-analog converter.

The converter CNA4 includes a synchronization stage ES and a conversion stage EC.

The synchronization stage ES is configured to receive the first digital signal SN1 including here for example 3 bits and the first clock signal Sclk1, and is configured to deliver three binary signals D1 to D3 that are synchronized with the first clock signal Sclk1.

The signal D1 represents the least significant bit (LSB) and the signal D3 represents the most significant bit (MSB).

The conversion stage EC includes here three differential stages 7, 8, 9, each of which includes a first respective n-type MOS transistor T7a, T8a, T9a and a second respective n-type MOS transistor T7b, T8b, T9b.

The sources of these first and second transistors T7a, T7b, T8a, T8b, T9a, T9b of each differential stage 7, 8, 9 are coupled jointly to the ground GND via bias transistors TP7, TP8, TP9 wired as current sources.

The gates of these bias transistors TP7, TP8, TP9 are configured to receive a bias voltage Vbias.

By choosing bias transistors TP7, TP8, TP9 of suitable size, the bias transistors TP7, TP8, TP9 operate as current sources with weighted currents I, 2I, 4I.

The gates of the first and second transistors T7a, T7b, T8a, T8b, T9a, T9b of each differential stage 7, 8, 9 form, respectively, differential inputs of each differential stage 7, 8, 9 and are configured to receive, respectively, the 1-bit signals D1, D2, D3.

The drains of the first and second transistors T7a, T7b, T8a, T8b, T9a, T9b of each differential stage 7, 8, 9 are respectively coupled to a first resistor R1 via a positive output terminal OUT+ and to a second resistor R2 via a negative output terminal OUT−. The first and second resistors R1, R2 are jointly coupled to a power source VDD.

The output terminals OUT+, OUT− form differential output terminals of the converter CNA4.

The differential stages 7, 8, 9 are respectively configured to steer their weighted current into the first or the second resistor R1 or R2 depending on the values of the signals D1, D2, D3.

For example, if the signals D1 and D3 are in the high state and the signal D2 is in the low state, the output terminal OUT+(or OUT−) receives the combination of the weighted currents I, 4I generated by the bias transistors TP7 and TP9, while the other output terminal OUT− (or OUT+) receives the weighted current 2I generated by the bias transistor TP8.

The converter CNA4 is configured to deliver, to the differential outputs OUT+ and OUT−, the first analog voltage signal SA1 according to the combination of the generated weighted currents I, 2I, 4I and of the first and second resistors R1, R2.

While the above disclosures have been illustrated and described in detail in the drawings and foregoing description, such illustration and description are considered illustrative or exemplary and not restrictive; the disclosures herein are not limited to the described embodiments. Other variations to the disclosed embodiments can be understood and effected by those skilled in the art, from a study of the drawings, the disclosure, and the appended claims.

The invention claimed is:

1. A device, comprising:
    an acquisition stage configured to receive a digital input signal and to generate, respectively, a first digital signal and a second digital signal, wherein the second digital signal is a logical inversion of the first digital signal;
    a first processing stage and a second processing stage that are configured to receive, respectively, the first digital signal and the second digital signal, the first processing stage configured to generate a first analog signal in time with a first clock signal from the first digital signal, and the second processing stage configured to generate a second analog signal in time with a second clock signal from the second digital signal, wherein the second clock signal is phase opposite of the first clock signal; and
    an output stage configured to generate an analog output signal equal to a selected one of the first analog signal or the second analog signal depending on the value of the first or second clock signal.

2. The device according to claim 1, wherein the digital input signal and the first and second digital signals each include N bits, and the acquisition stage comprises N logic inverter circuits that are configured to generate, respectively, N bits of the second digital signal from N bits of the digital input signal.

3. The device according to claim 1, wherein the first and second processing stages each include a digital-to-analog converter.

4. The device according to claim 3, wherein each digital-to-analog converter of the first and second processing stages is a current-steering digital-to-analog converter.

5. The device according to claim 1, wherein the first and second processing stages are identical.

6. The device according to claim 1, wherein the output stage comprises an analog multiplexer configured to generate the analog output signal as equal to the first analog signal in response to a first logic state of the first or second clock signal or equal to the second analog signal in response to a second logic state of the first or second clock signal.

7. The device according to claim 6, wherein the analog output signal has a phase shift corresponding to at least to the duration of a transient state of the first or second analog signal in a period of the first clock signal or the second clock signal.

8. The device according to claim 1, produced in an integrated manner.

9. The device according to claim 1, wherein the device comprises a communication system comprising an electronic device, the electronic device comprising the acquisition stage, the first processing stage, and the output stage.

10. The device according to claim 1, wherein the device comprises a mobile phone including a communications system, the communications system comprising an electronic device, the electronic device comprising the acquisition stage, the first processing stage, and the output stage.

11. A device, comprising:
    an acquisition stage configured to receive a digital input signal and generate a first digital signal and a second digital signal, wherein the second digital signal is a complement of the first digital signal;
    a first digital to analog converter configured to convert the first digital signal to a first analog signal in time with a first clock signal;
    a second digital to analog converter configured to convert the second digital signal to a second analog signal in time with a second clock signal;
    wherein the second clock signal is a complement of the first clock signal; and
    an output stage configured to:
        generate an internal clock signal equivalent to one of: the first clock signal phase shifted by a duration of a transient state of the first clock signal that occurs during a period of the first clock signal, or the second clock signal phase shifted by a duration of a transient state of the second clock signal that occurs during a period of the second clock signal;
        produce an analog output signal equal to the first analog signal when the internal clock signal is at a first logic level; and
        produce the analog output signal equal to the second analog signal when the internal clock signal is at a second logic level opposite the first logic level.

12. The device of claim 11, wherein the first and second digital to analog converters are each a current steering digital to analog converter.

13. The device according to claim 11, wherein the digital input signal and the first and second digital signals each include N bits, and the acquisition stage comprises N inverter circuits configured to generate, respectively, N bits of the second digital signal from N bits of the digital input signal.

14. The device according to claim 11, wherein the output stage comprises an analog multiplexer.

15. A method, comprising:
    generating from a digital input signal a first digital signal and a second digital signal, wherein the second digital signal is a complement of the first digital signal;
    converting the first digital signal to a first analog signal in time with a first clock signal;
    converting the second digital signal to a second analog signal in time with a second clock signal, wherein the second clock signal is a complement of the first clock signal;
    generating an internal clock signal equivalent to one of the first clock signal phase shifted by a duration of a transient state of the first clock signal that occurs during a period of the first clock signal, or the second clock signal phase shifted by a duration of a transient state of the second clock signal that occurs during a period of the second clock signal; and
    producing an analog output signal by:
        selecting the first analog signal as the analog output signal in response to a first logic state of the internal clock signal, and selecting the second analog signal as the analog output signal in response to a second logic state of the internal clock signal.

16. The method of claim 15, wherein the digital input signal and the first and second digital signals each include N bits.

* * * * *